US011714927B2

(12) United States Patent
Ghosh

(10) Patent No.: US 11,714,927 B2
(45) Date of Patent: Aug. 1, 2023

(54) VIRTUAL PHYSICAL DIGITAL TWIN ECOSYSTEM

(71) Applicant: International Business Machines Corporation, Armonk, NY (US)

(72) Inventor: Partho Ghosh, Kolkata (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/407,467

(22) Filed: Aug. 20, 2021

(65) Prior Publication Data
US 2023/0056673 A1 Feb. 23, 2023

(51) Int. Cl.
*G06F 30/10* (2020.01)
*H04L 67/52* (2022.01)

(52) U.S. Cl.
CPC .............. *G06F 30/10* (2020.01); *H04L 67/52* (2022.05)

(58) Field of Classification Search
CPC .................................. G06F 30/10; H04L 67/12
See application file for complete search history.

(56) References Cited

U.S. PATENT DOCUMENTS

| 9,967,391 | B2 | 5/2018 | Frenz |
| 10,678,266 | B2 | 6/2020 | Erickson |
| 10,686,687 | B2 | 6/2020 | Matthews |
| 2011/0148634 | A1* | 6/2011 | Putz ........................ G08B 21/22 340/541 |
| 2021/0012556 | A1 | 1/2021 | Watkins |
| 2021/0342836 | A1* | 11/2021 | Celia ....................... H04L 67/12 |

OTHER PUBLICATIONS

Anonymous. "Geofencing Mobile Assets and Industrial Equipment with IoT Sensors—Video Tutorial." Printed Jul. 28, 2021. 4 pages. Published by Valarm. https://www.valarm.net/blog/geofencing-iot-sensors-mobile-industrial-equipment-geofence/.
Barig, et al., "Assistance systems for Industry 4.0 environments." Published Feb. 2019. 7 pages. In 17th embedded world Conference 2019. Published by Research Gate, https://www.researchgate.net/publication/331673690_Assistance_systems_for_Industry_40_environments.
Becue, et al., "A New Concept of Digital Twin Supporting Optimization and Resilience of Factories of the Future." Published Jun. 28, 2020. 32 pages. In Appl. Sci. 2020, 10(13), 4482. Published by MDPI. https://www.mdpi.com/2076-3417/10/13/4482/htm.
Javed, et al., "Enforcing Geofences for Managing Automated Transportation Risks in Production Sites." Published Aug. 2020. 13 pages. In Dependable Computing—EDCC 2020 Workshops, pp. 113-126. Published by Research Gate. https://www.researchgate.net/publication/343983431.

(Continued)

*Primary Examiner* — Normin Abedin
(74) *Attorney, Agent, or Firm* — Jared L. Montanaro

(57) ABSTRACT

A processor may receive a geofence perimeter of a geospatial region. The processor may analyze one or more objects within the geofence perimeter. The processor may generate a digital twin ecosystem. The digital twin ecosystem may include digital copies of the one or more objects. The processor may present a simulation of the digital twin ecosystem to a user.

17 Claims, 6 Drawing Sheets

(56) References Cited

OTHER PUBLICATIONS

Mell, et al., "The NIST Definition of Cloud Computing," Recommendations of the National Institute of Standards and Technology, U.S. Department of Commerce, Special Publication 800-145, Sep. 2011, 7 pgs.
Pultar, Edward. "Industrial IoT + Geofencing for Monitoring Mobile Assets with Sensors." Published Nov. 26, 2018. 4 pages. Published by Medium. https://medium.com/@edwardpultar/industrial-iot-geofencing-for-monitoring-mobile-assets-with-sensors-1e9e1424ae43.
Zafari, et al., "Microlocation for Internet-of-Things-Equipped Smart Buildings." Published Feb. 2016. 17 pages. In IEEE Internet of Things Journal, vol. 3, No. 1, pp. 96-112. Published by IEEE. https://ieeexplore.ieee.org/document/7120085.

\* cited by examiner

VIRTUAL PHYSICAL DIGITAL TWIN ECOSYSTEM

BACKGROUND

The present disclosure relates generally to the field of digital twins, and more specifically to geofence-based generation of cyber-physical digital twin ecosystems.

A geofence is a virtual perimeter for a real-world positioning area. A geofence can either be dynamically generated, as in a radius around a point location or object or asset, or a geofence can be a predefined set of boundaries, such as school zones, neighborhood boundaries, etc.

Further, a digital twin is a digital representation of a real-world physical component, product, equipment, or object. Digital twins can mainly be classified into two categories, namely, static and dynamic digital twins. The former type of digital twins neither change in shape nor are affected by data streams. However, the latter type of digital twins continues changing based on updated streams of data; they capture live performances of the real/physical objects. Thus, they always stay updated and can be altered instantaneously.

SUMMARY

Embodiments of the present disclosure include a method, computer program product, and system for generation of a cyber-physical digital twin ecosystem. A processor may receive a geofence perimeter of a geospatial region. The processor may analyze one or more objects within the geofence perimeter. The processor may generate a digital twin ecosystem. The digital twin ecosystem may include digital copies of the one or more objects. The processor may present a simulation of the digital twin ecosystem to a user.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of certain embodiments and do not limit the disclosure.

Figure 1A:
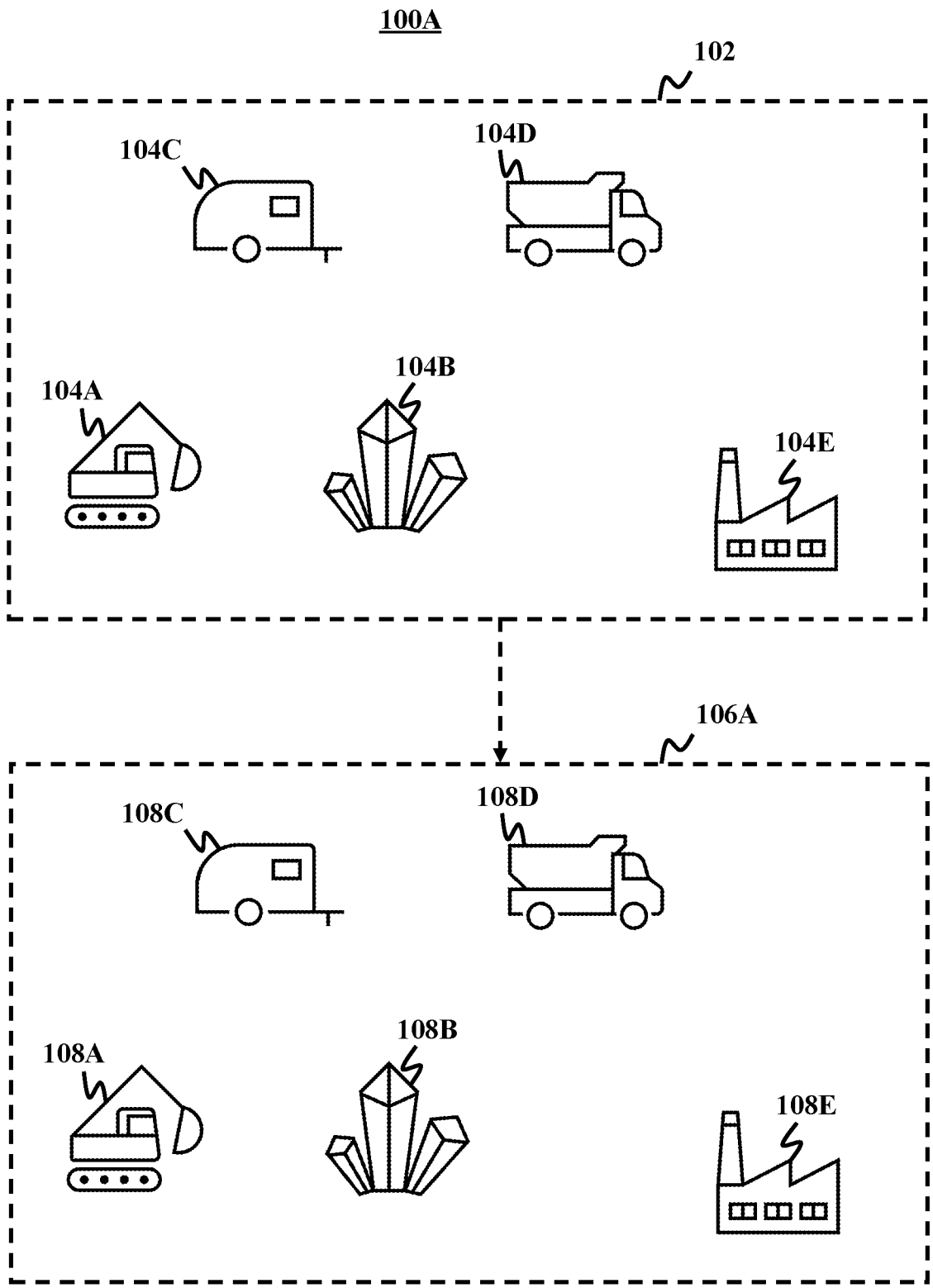
FIG. 1A illustrates an example of a digital twin ecosystem, in accordance with aspects of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the disclosure.

DETAILED DESCRIPTION

Aspects of the present disclosure relate generally to the field of digital twins, and more specifically to geofence-based generation of cyber-physical digital twin ecosystems. While the present disclosure is not necessarily limited to such applications, various aspects of the disclosure may be appreciated through a discussion of various examples using this context.

A geofence is a virtual perimeter for a real-world positioning area. A geofence can either be dynamically generated, as in a radius around a point location or object or asset, or a geofence can be a predefined set of boundaries, such as school zones, neighborhood boundaries, etc.

By setting up a geofence, an application, a user, or any other entity can be notified when a computing device triggers the geofence (e.g., by entering a geofence, exiting a geofence, or dwelling in the geofence for a duration). Geofences can also be used for distributing or delivering content (e.g., advertisements, online content, content items, websites, online documents, articles, blogs, posts, images, video, audio, or multimedia content). Whether one is monitoring industrial assets, pumps, tanks, chemicals, vehicles, sensors, or anything else, geofences alert a user when anything is inside or outside of their custom geofence zones/perimeters of a geospatial region.

Further, the rapid advancements in computing, storage, communications, and networking technologies have enabled the creation of digital twins. A digital twin is a digital representation of a real-world physical component, product, equipment, or object. Digital twins can mainly be classified into two categories, namely, static and dynamic digital twins. The former type of digital twins neither change in shape nor are affected by data streams. However, the latter type of digital twins continues changing based on updated streams of data; they capture live performances of the real/physical objects. Thus, they always stay updated and can be altered instantaneously.

However, the current problems with dynamic digital twins are:

1) a lack of seamless connectivity between digital twins (e.g., dynamic digital twins can greatly benefit from being connected to each other, leading to increased efficiency, shared insights, saved time and reduced costs);

2) there can be status, functional, operational dependencies of one twin on another twin (e.g., dynamic digital twins could have a dependency on another digital twin, which could lead to a loss of efficiency of a computing system trying to determine which digital twin takes priority);

3) there can be a lack of adherence to security policies, access-control rights (complete, partial, or null), and/or data exchange between one or more dependent twins;

4) there could be access to raw sensor data, querying APIs/Microservices, to a sharing of visualizations and a documenting of high-level decisions (e.g., one digital twin could have access to information or data it should not have);

5) there could be an issue with priority and hierarchical notifications (e.g., which digital twin of an object/asset should be prioritized); and 6) there could be difficulty in the virtual tracking of assets, blocking of assets, health of assets, etc. (e.g., with a constant updating of data related to objects of a dynamic digital twin, it could be cumbersome/taxing on a computing system to track all the objects/assets efficiently).

Accordingly, there is a need for a solution that can: create/generate a dynamic digital twin ecosystem from a static and/or dynamic geofence around a point location, object, or asset, or another geofence and/or combination of the above; enable seamless exchange of/between a digital twin and/or child twins and their associated aspects, such as, but not limited to a model, metadata, insights, status and control, etc.; enable seamless interaction and exchange of events between digital twins, (e.g., status/operational/monitoring between one or many digital twins); and dynamically and automatically apply data governance, provenance and security guidelines and compliance for one or more digital twin in an ecosystem.

Appropriately, discussed herein is such a solution, which based on a geofenced location can intelligently (e.g., by way of artificial intelligence/machine learning utilization) generate/create a dynamic digital twin ecosystem of all physical (e.g., objects), non-physical (e.g., pathways, routes, etc.), virtual, dynamic, and static assets, processes, and systems enclosed in the considered static, dynamic, time-based, and conditional geofenced location/area.

Using multifarious (e.g., layered, overlapping, etc.) discrete digital twins and/or composite twins of the geofenced real-world location replicated in cyberspace the disclosed solution is able to exchange, converge, merge, split, replicate, and synthesize digital twin payloads and digital twin events to generate new composite twins that do not exist in the real world using digital twin-based computation.

In some embodiments, the proposed solution may be able to merge dynamic, or moveable, digital twins' payloads entering into and/or leaving the geofenced digital twinned area thereby generating new composite twins, which inherit the status, operational and health twin of the dynamic twins (e.g., if there are partial copies of an object, the copies can be merged to make a full copy/digital twin and the full copy inherits all features of the partial copies). The proposed solution may further use blockchain enabled smart contracts for dynamic asset health while entering or leaving a digital twinned area (e.g., upon entry and/or departure of the geofenced area, a digital twin of an object could identify if the real-world object is working correctly). For example, a truck entering and leaving the geofenced area could be analyzed to determine if there is damage to the truck or if tire pressure is low.

In some embodiments, the proposed solution may enable hierarchical designation of digital twins that filter or prioritize data, models, status, operational notifications, and events in a multi-layered or overlapping geofenced digital twins, such that if a second twin is active it would take precedence and when inactive, the first twin would take the precedence of simulating data, broadcasting notifications, data, etc. As an example, there may be more than one geofenced areas and a portion of the areas may overlap. Accordingly, more than one digital twins could be generated for the same object. Thus, when it is identified that the object is in one area, the digital twin associated with that area would take precedence over the digital twin associated with the other area(s).

In some embodiments, the proposed solution may be able to generate a dynamic geofenced derived digital twin exchange platform where the proposed solution will enable seamless exchange of twin dependencies and twin exchange of multifarious discrete, composite, status, operational, simulation twins. Thereby enabling robust simulation, prioritization, and status dependency injection of operational, procedural, and predictive maintenance of all the involved discrete and/or composite twins.

Based on the digital twin ecosystem data and all involved twins, the proposed solution may be able to generate a virtual 3-D visualization of the static, moveable, dynamic assets, and location and geofence information. Thereby generating a mixed reality association between the real and virtual world in an augmented reality system. For example, a user using a virtual reality headset could view a 3-D representation of all the digital twin copies of objects, and their routes/movements, within the geofenced area.

In some embodiments, using digital twin simulation and computing, the proposed solution may enable local and global assistant systems that can be trained on intents and entities derived from discrete and composite digital twins defined and prioritized. For example, an assistant system could identify that a digital twin of an object is a car, and that the car typically moves along a defined path (e.g., a road). The assistant system could then determine that the car, in the future/predictively, that the car is likely to go down the same path. In such an embodiment, a virtual representation displayed to a user could show the car driving down the path. In some embodiments, the proposed solution can further generate corpuses of all the entities, intents involved in a local, layered, overlapping, and/or entire ecosystem of geofenced digital twin.

Before turning to the FIGS. it may be beneficial to detail various terms and uses associated with the proposed solution. Accordingly, digital twins are virtual replicas of real-world living or non-living assets/objects and are dynamic simulations of physical behavior, which can range from a single tire to a whole factory, etc. Digital twins are the link between the real world and cyberspace that has been exploited with the advancement of IOT and ICT (Information and Communication Technology); digital twins can be virtual replicas of a physical or non-physical system across the systems life cycle, which can be helpful to understand real time data for analysis, reasoning, and understanding (e.g., a digital twin can identify a problem or solution in real time based on the usage of their replicated/copied objects).

Typically, a digital twin model describes the characteristics, attributes, and behavior of an entity type where an entity includes physical assets, non-physical assets, dynamic assets, static assets, processes, and systems. Further, data in a digital twin usually does not come from a single source; it is important to understand that a digital twin is not a single massive data lake that contains all the information about an entity. A digital twin is focused on the way its model describes where information resides, and the model is not the digital twin. The model is a description of characteristics, attributes, and behaviors that define what a digital twin's structure looks like, but the digital twin is the unique instance for a specific entity.

In some instances, there can be multiple types of digital twins that can be generated and/or utilized for the disclosed solution discussed herein. For instance, a discrete digital twin can be generated/utilized and is a type of digital twin with the lowest level of abstraction that is still sufficient to meet the requirements of a specific use case. It is often a single or atomic entity where it adds no value to break an asset/object down to component parts/processes/etc. In another instance, a composite digital twin can be generated/utilized and is a type of digital twin that is a combination of discrete digital twins that represent an entity comprised of multiple individual components or parts. Further, a composite digital twin can be an assembly twin, or a composite digital twin can be a system twin that comprises multiple assembly twins such as processing and refinement units.

In yet another instance, a status twin can be generated/utilized. A status twin is typically used for basic condition monitoring of applications, such as, dashboards and simple alerting systems. A status twin indicates operating parameters and is generally generated with visualization tools. Further, an operational twin can be utilized/generated, and such a digital twin provides more extensive information that is typically used in decision support by operators, reliability engineers, and other decision-makers. An operation twin is linked to a set of actions or workflows where users can interact with the twin and change operating parameters where control capability is allowed.

In some instances, a simulation twin can be generated/utilized, and is a type of digital twin that leverages different types of simulations or artificial intelligence capabilities to predict, forecast, and/or provide insight into future operational states. One can a simulation twin for predictive maintenance or to improve the recovery yield of a processing plant. It is noted that while a digital twin (e.g., simulation twin) begins its life as a model/simulation, it becomes more powerful when it starts to receive real-time data from its real-world counterpart. The digital twin simulation then becomes active and changes as the data is delivered. Because it dynamically changes based on this data, the digital twin matures through the product lifecycle. As a result, the digital twin yields valuable information that is not generated by a traditional simulation, and which can drive business decisions automatically and autonomously.

In some embodiments, the proposed solution discussed herein is a part of/is a digital twin exchange. A digital twin exchange is a platform where manufacturers, third parties, digital content providers, and/or any open source can sell/exchange digital resources related to a physical or non-physical asset to owners and operators.

It is noted that digital twin computing represents a new computing paradigm that goes beyond physical reproduction of the real world by achieving interactive effects among digital twins including the inner state of objects in cyberspace (e.g., underlying components, predicted routes, etc.). With digital twin computing, the proposed solution can configure a virtual ecosystem composed of a variety of digital twins. The proposed solution can replicate, in cyberspace, digital twins of single entities in the real world, and/or exchange and/or fuse some of the elements constituting different digital twins to generate new digital twins that do not exist in the real world. With such an advancement disclosed herein it also means that so-called conventional digital twins can be seamlessly linked rather than having mutual compatibility. For example, if a truck is identified within a certain geofence and simulated and then a trailer is also identified within the certain geofence and simulated, the proposed solution could either simulate a generic representation of a vehicle to a user or combined the truck and trailer in a present that simulation to the user.

In some embodiments, a network of digital twins synchronizes the virtual, physical, conditional, and commercial definitions of assets in real time to optimize operating performance conditions, predict service or repair requirements, improve diagnostics, and/or enhance decision-making through combined technical and business information.

In some embodiments, by assigning geofences to devices deployed in finance, research, IT, etc. the proposed solution can ensure that a device is non-operational outside of the designated geofence. For instance, utilizing a master data management (MDM) tool, an IT entity can define multiple geofences for various areas of operation and can make the device obsolete outside of the geofences. Every time the device enters or leaves the geofence, the IT entity will be notified, and they can track the situation of the device and check for compliance disturbances, if any. This ensures that critical data on the device is secure at all times and cannot be accessed outside of designated premises. In such an embodiment, the digital twins could be analyzed to predict a usage of the devices and help identify compliance usage.

In some embodiments involving logistics and transport, devices within a geofence can help track the routes/delivery situations of vehicles in the real time. This ensures timely support in case of a breakdown of a vehicle, as well as device and vehicle security. Further, in such an embodiment, geofencing is used to assist the modeling algorithm in performing decisions to reroute cargo/vehicles when detours or slowdowns arise.

Figure 1B:
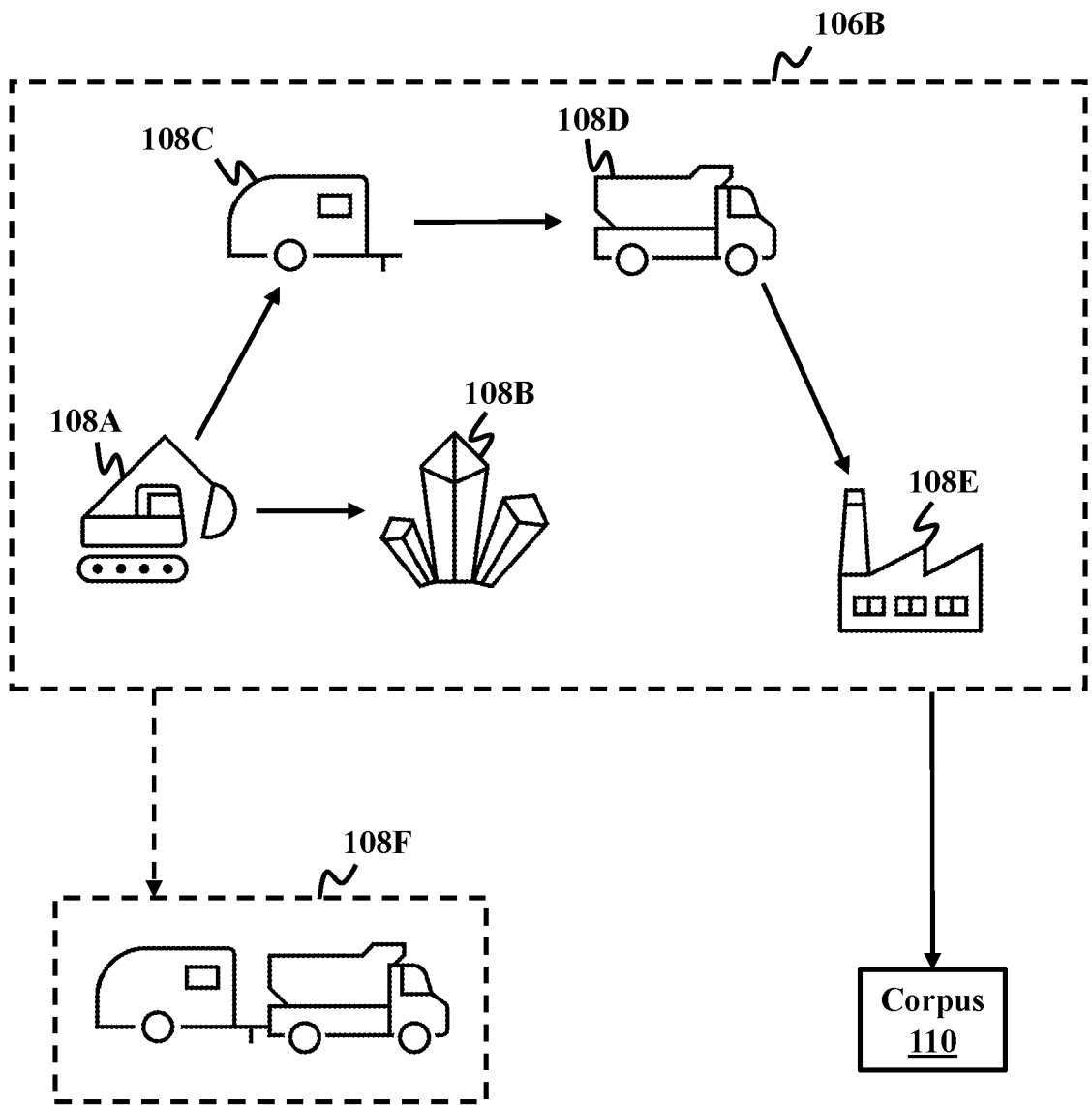
FIG. 1B further illustrates an example of a digital twin ecosystem, in accordance with aspects of the present disclosure.

Referring now to FIGS. 1A and 1B, which respectively illustrate an example of digital twin ecosystems 100A and 100B, in accordance with aspects of the present disclosure. It is noted that like reference numerals are used to designate like parts in the accompanying drawings. Further noted is that the digital twin ecosystems 100A and 100B may be the same, or a part of, the same digital twin ecosystem.

As depicted, the digital twin ecosystem 100A includes a geofence area 102 of physical objects 104A-E (e.g., assets), which is transitioned into a digital twin area 106A of the geofence area 102 with digital twin copies 108A-E of the physical objects 104A-E. As further depicted, the digital twin ecosystem 100B may include a digital twin area 106B (which may be the same as the digital twin area 106A) with the same digital twin copies 108A-E, however the digital twin area 106B of the digital twin ecosystem 100B may include predicted routes (to be discussed more fully below) of the digital twin copies 108A-E.

Additionally, the digital twin ecosystem 100B includes a combined object 108F, which can be a combination/merging of predicted and/or partial objects into a full object/simulated digital twin. As depicted, the combined object 108F is a combining of the digital twin copies 108C and 108D. The digital twin ecosystem 100B further includes a corpus 110 that may house/store information associated with the either the physical objects 104A-E and/or the digital twin copies 108A-E, which can then later be used to make predictions associated with the physical objects 104A-E and/or the digital twin copies 108A-E.

Before turning to an in-depth example associated with FIGS. 1A and 1B, it may be beneficial to discuss the overall benefits provided by such digital twin ecosystems as 100A and 100B. Accordingly, either of the digital twin ecosystems 100A and 100B, or both, may be able to, based on the geofenced perimeter of the geospatial area 102 (e.g., region), to generate/create an digital twin area 106 of all the physical (e.g., trucks, mining materials, trailers, etc.) and non-physical assets (e.g., pathways, routes, etc., which are depicted as the solid arrows between the objects 108A-E in the digital twin area 106B) in the geospatial area 102.

Further, the digital twin ecosystems 100A and 100B may be able to generate, decorate, or composite any of the digital twin copies 108A-E based on multifarious discrete twins (e.g., the combined object 108F from the digital twin copies 108C and 108D). In such an embodiment, composite/combined twins would be able to seamlessly exchange twin dependencies, and twin exchange, thus leading to a more robust simulation, prioritization, and status dependency injection of operational, procedural, and predictive maintenance of all the involved discrete and/or composite twins (e.g., if one component of a composite twin is below a certain threshold, the other component can be flagged for maintenance as well).

In some embodiments, using digital twin computing, the digital twin ecosystems 100A and 100B may dynamically fuse, or split, or exchange digital twin payloads of existing geofenced assets like moveable twins entering or leaving a geofenced digital twinned area thereby creating new digital twins. For example, if the digital with copy 108D is a truck moving in and out of a geofenced work area, a first digital twin of the truck may be a partial image/digital twin of the back of the truck as the truck was moving too fast for a full scan upon entry of the geofenced work area. On the way out of the geofenced work area a second partial image/digital twin of the front of the truck may be generated and then combined to make a full digital twin of the truck.

In some embodiments, the digital twin ecosystems 100A and 100B may be generated as an exchange platform of the entire geofence area 102, where the exchange platform is a plurality of discrete, composite, assembly, and/or system twins that can dynamically interact with each other to provide seamless exchange of twin dependencies and twin exchange thus leading to a more robust simulation, prioritization, and status dependency injection of operations within the digital twin ecosystems 100A and 100B.

In some embodiments, based on data from/associated with the digital twin ecosystems 100A and 100B, and all involved twins (e.g., digital twin copies 108A-E), the digital twin ecosystems 100A and 100B may be able to generate a virtual 3D visualization of static, moveable, and/or dynamic assets, location, and geofence information, thus generating a mixed reality association between the real and virtual world in an augmented reality system.

In some embodiments, the digital twin ecosystems 100A and 100B may generate a network digital twin, which refers to a computer simulation model of a communication network, along with its operating environment and the application traffic that it carries. The network dynamics are typically generated by the interplay among the communication protocol, device configurations, network topology, application traffic, and the physical environment.

In some embodiments, the digital twin ecosystems 100A and 100B may be able to rank, based on hierarchy, and filter notifications and status updates for a geofenced digital twin (e.g., digital twin copies 108A-E) and/or plurality of geofenced twins involved in a geospatial region (e.g., geofence area 102).

As previously discussed, in some embodiments related to the simulating/simulation, triggering two overlapping digital twins may affect data and notifications tied to the simulation/modeling, hence, the digital twin ecosystems 100A and 100B may enable hierarchical designation of digital twins where if a second twin is active, that would take precedence, and when inactive, a first twin would take the precedence of simulating data, broadcasting notifications, etc.

In some embodiments, utilizing digital twin simulation and computing, the digital twin ecosystems 100A and 100B may enable local and global assistant systems that may be trained on intents and entities derived from discrete and composite digital twins defined, graded, and prioritized (e.g., intended/predicted uses of objects/assets could be identified, a stationary object could be ranked below a movable object, etc.).

Now turning to a detailed example of what is depicted in FIGS. 1A and 1B. In some embodiments, the digital twin ecosystems 100A and 100B and/or a processor (e.g., computing device, etc.) may generate, or be generated based on, a geofence and fences of entire or multiple areas of a mining ecosystem, where geofences can be static, dynamic, time-based, conditional, etc. In some embodiments the geofences (e.g., the geofence area 102) may be a layered geofence and/or an overlapping geofence.

In some embodiments, the digital twin ecosystems 100A and 100B may be able to add time based geofences for and excavation area (e.g., the geofence area 102), where the geofences can be on the basis of operation and non-operation times. The digital twin ecosystems 100A and 100B may also be able to generate geofences for physical, non-physical, virtual, dynamic, and static assets (e.g., digital twin copies 108A-E) in the mining ecosystem (e.g., digital twin areas 106A and/or 106B). In some embodiments, physical, non-physical, virtual, dynamic and static assets, processes, and systems can be enclosed in any combination of a static, dynamic, time-based and/or conditional (e.g., area only monitored when a particular event is happening, etc.) geofenced area.

In some embodiments, the digital twin ecosystems 100A and 100B may be able to generate a digital twin exchange platform where the digital twin ecosystems 100A and 100B can then enable seamless exchange of twin dependencies and twin exchange of multifarious twins in geofenced based mining. In some embodiments, the digital twin ecosystems 100A and 100B thereby enable robust simulation, prioritization, and status dependency injection of operational, procedural, and predictive maintenance of all the involved discrete and/or composite twins.

For example, as depicted in FIGS. 1A and 1B, the excavation area is the geofence area 102 with the physical objects 104A-E (e.g., an excavator/physical object 104A, mining materials/physical object 104B, a trailer/physical object 104C, a truck/physical 104D, and a processing facility/physical object 104E. The geofence area 102 with the physical objects 104A-E are then simulated as the digital twin area 106A with the digital twin copies 108A-E.

The digital twin area 106A could then be updated, due to the seamless exchange of twin dependencies, etc. with predicted operational paths for each of the digital twin copies 108A-E. Furthering the example, that is, the digital twin of the excavator (e.g., 108A) could have a predicted path of mining materials for the digital twin of the mining material (e.g., 108B) and then transfer the mining material to the digital twin of the trailer (e.g., 108C). Another predicted path could indicate that the digital twin of the trailer is connected to the digital twin of the truck (e.g., 108D) and the digital twin of the truck could go to the digital twin of the facility (e.g., 108E) for processing.

Further, in an embodiment where the digital twins are displayed to a user, in an augmented reality view, or in a 3D visualization, the digital twin copies 108A-E could be shown actually traversing/moving along their predicted paths. Even further, the digital twin copies 108A-E could be combined to generate predicted/logical digital twins. For example, a digital twin of the truck and trailer together (e.g., 108F). In some embodiments, the digital twin ecosystems 100A and 100B may generate corpuses (e.g., corpus 110) of all the entities, intents involved in a local, layered, overlapping and/or entire geofenced digital twin (e.g., digital twin area 106A and/or 106B).

Figure 2:
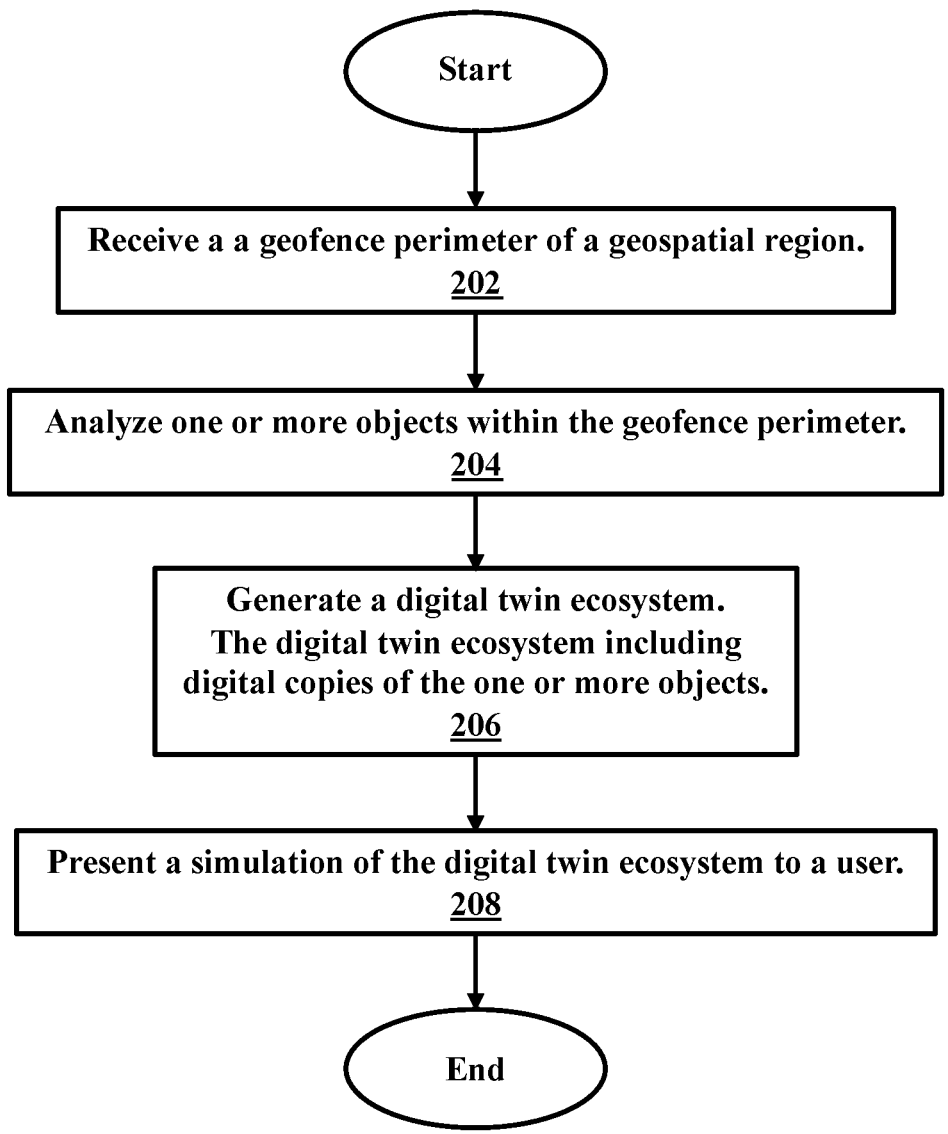
FIG. 2 illustrates a flowchart of an example method for generation of a cyber-physical digital twin ecosystem, in accordance with aspects of the present disclosure.

Referring now to FIG. 2, illustrated is a flowchart of an example method 200 for generation of a cyber-physical digital twin ecosystem, in accordance with aspects of the present disclosure. In some embodiments, the method 200 may be performed by a processor (e.g., of the digital twin ecosystem 100A and/or 100B of FIGS. 1A and 1B, etc.).

In some embodiments, the method 200 begins at operation 202 where the processor receives a geofence perimeter of a geospatial region. In some embodiments, the method 200 proceeds to operation 204 where the processor analyzes one or more objects within the geofence perimeter.

In some embodiments, the method 200 proceeds to operation 206 where the processor generates a digital twin ecosystem. The digital twin ecosystem may include digital copies of the one or more objects. In some embodiments, the method 200 proceeds to operation 208 where the processor presents a simulation of the digital twin ecosystem to a user.

In some embodiments, discussed below, there are one or more operations of the method 200 not depicted for the sake of brevity and which are discussed throughout this disclosure. Accordingly, in some embodiments, generating the digital twin ecosystem may include the processor identifying that at least one of the digital copies of the one or more objects is a partial copy. The processor may further identify that there is a second partial copy of the same at least one of the digital copies and combine the partial copy and the second partial copy to make a full copy of the at least one of the digital copies.

In some embodiments, the processor may analyze the partial copy and the second partial copy. The processor may determine based on the analyzing, that the at least one of the digital copies associated with the partial copy and second partial copy is a moveable object. The processor may further predict payload information (e.g., how much of a mining material a truck can haul at once, etc.) for the moveable object.

In some embodiments, determining that the at least one of the digital copies associated with the partial copy and second partial copy is the moveable object includes the processor identifying that the partial object is in a first area of the geofence perimeter and identifying that the second partial object is in a second area of the geofence perimeter. For example, for an overlapping geofence and object could be simulated in a first area and a second area, but only partially. The simulations from the areas could then be combined to make a full image.

In some embodiments, determining that the at least one of the digital copies associated with the partial copy and second partial copy is the moveable object includes the processor identifying that the partial object is in a first area of the geofence perimeter and identifying that the second partial object is outside the geofence perimeter.

In some embodiments, generating the digital twin ecosystem includes the processor identifying that at least one of the digital copies of the one or more objects is a full copy and identifying that there is a partial copy of the same at least one of the digital copies, where the partial copy is outside the geofence perimeter. The processor may parse the full copy to an instance missing from the partial copy and combine the instance with the partial copy. For example, before removing pieces of mining material (e.g., rock, minerals, etc.) from an area, a complete digital twin of the mining material can be simulated. At a later time, a second digital twin of the mining material missing pieces can be simulated. In order to identify how quickly the material is being mined, the proposed solution may display a 3D representation of the full, unmined mining material to the user with an outline of the now missing/mined material.

In some embodiments, generating the digital twin ecosystem includes the processor identifying that at least one of the digital copies of the one or more objects is a full copy and identifying that there is a partial copy of the same at least one of the digital copies. The processor may rank the full copy above the partial copy and present the full copy in the simulation of the digital twin ecosystem to the user.

It is to be understood that although this disclosure includes a detailed description on cloud computing, implementation of the teachings recited herein are not limited to a cloud computing environment. Rather, embodiments of the present disclosure are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of portion independence in that the consumer generally has no control or knowledge over the exact portion of the provided resources but may be able to specify portion at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 3A:
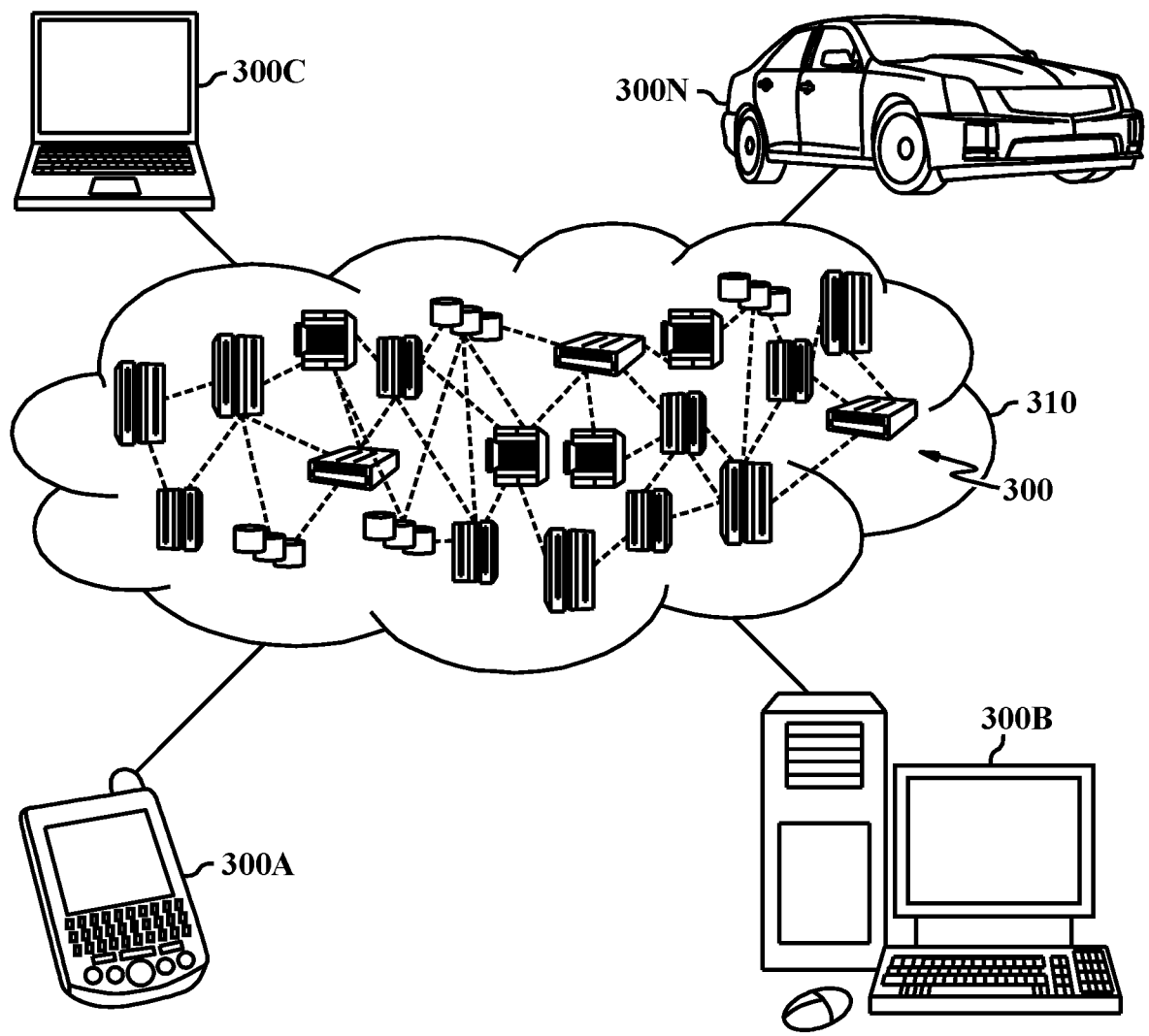
FIG. 3A illustrates a cloud computing environment, in accordance with aspects of the present disclosure.

FIG. 3A, illustrated is a cloud computing environment 310 is depicted. As shown, cloud computing environment 310 includes one or more cloud computing nodes 300 with which local computing devices used by cloud consumers, such as, for example, personal digital assistant (PDA) or cellular telephone 300A, desktop computer 300B, laptop computer 300C, and/or automobile computer system 300N may communicate. Nodes 300 may communicate with one another. They may be grouped (not shown) physically or virtually, in one or more networks, such as Private, Community, Public, or Hybrid clouds as described hereinabove, or a combination thereof.

This allows cloud computing environment 310 to offer infrastructure, platforms and/or software as services for which a cloud consumer does not need to maintain resources on a local computing device. It is understood that the types of computing devices 300A-N shown in FIG. 3A are intended to be illustrative only and that computing nodes 300 and cloud computing environment 310 can communicate with any type of computerized device over any type of network and/or network addressable connection (e.g., using a web browser).

Figure 3B:
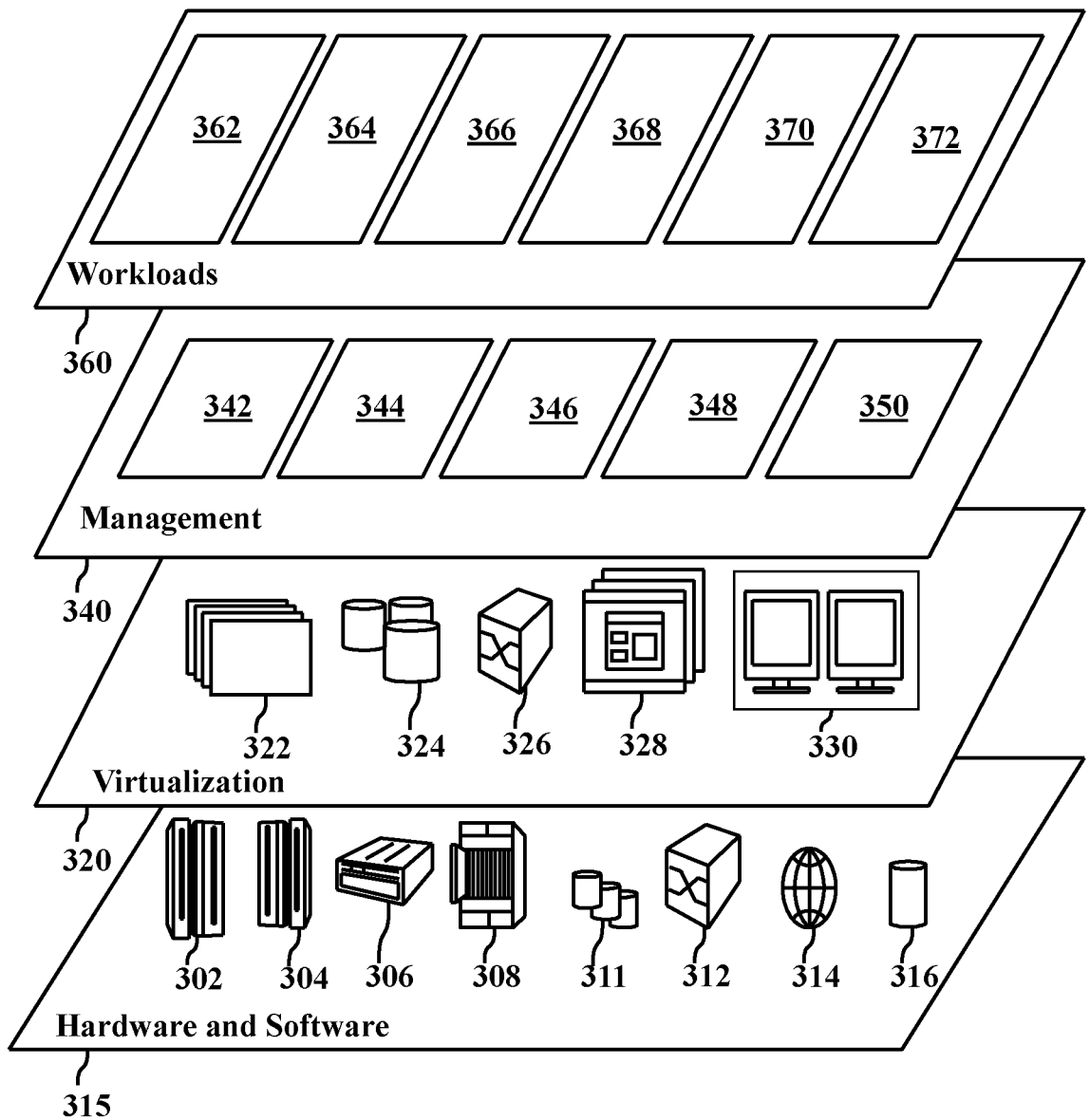
FIG. 3B illustrates abstraction model layers, in accordance with aspects of the present disclosure.

FIG. 3B, illustrated is a set of functional abstraction layers provided by cloud computing environment 310 (FIG. 3A) is shown. It should be understood in advance that the components, layers, and functions shown in FIG. 3B are intended to be illustrative only and embodiments of the disclosure are not limited thereto. As depicted below, the following layers and corresponding functions are provided.

Hardware and software layer 315 includes hardware and software components. Examples of hardware components include: mainframes 302; RISC (Reduced Instruction Set Computer) architecture based servers 304; servers 306; blade servers 308; storage devices 311; and networks and networking components 312. In some embodiments, software components include network application server software 314 and database software 316.

Virtualization layer 320 provides an abstraction layer from which the following examples of virtual entities may be provided: virtual servers 322; virtual storage 324; virtual networks 326, including virtual private networks; virtual applications and operating systems 328; and virtual clients 330.

In one example, management layer 340 may provide the functions described below. Resource provisioning 342 provides dynamic procurement of computing resources and other resources that are utilized to perform tasks within the cloud computing environment. Metering and Pricing 344 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 346 provides access to the cloud computing environment for consumers and system administrators. Service level management 348 provides cloud computing resource allocation and management such that required service levels are met. Service Level Agreement (SLA) planning and fulfillment 350 provide pre-arrangement for, and procurement of, cloud computing resources for which a future requirement is anticipated in accordance with an SLA.

Workloads layer 360 provides examples of functionality for which the cloud computing environment may be utilized. Examples of workloads and functions which may be provided from this layer include: mapping and navigation 362; software development and lifecycle management 364; virtual classroom education delivery 366; data analytics processing 368; transaction processing 370; and generation of a cyber-physical digital twin ecosystem 372.

Figure 4:
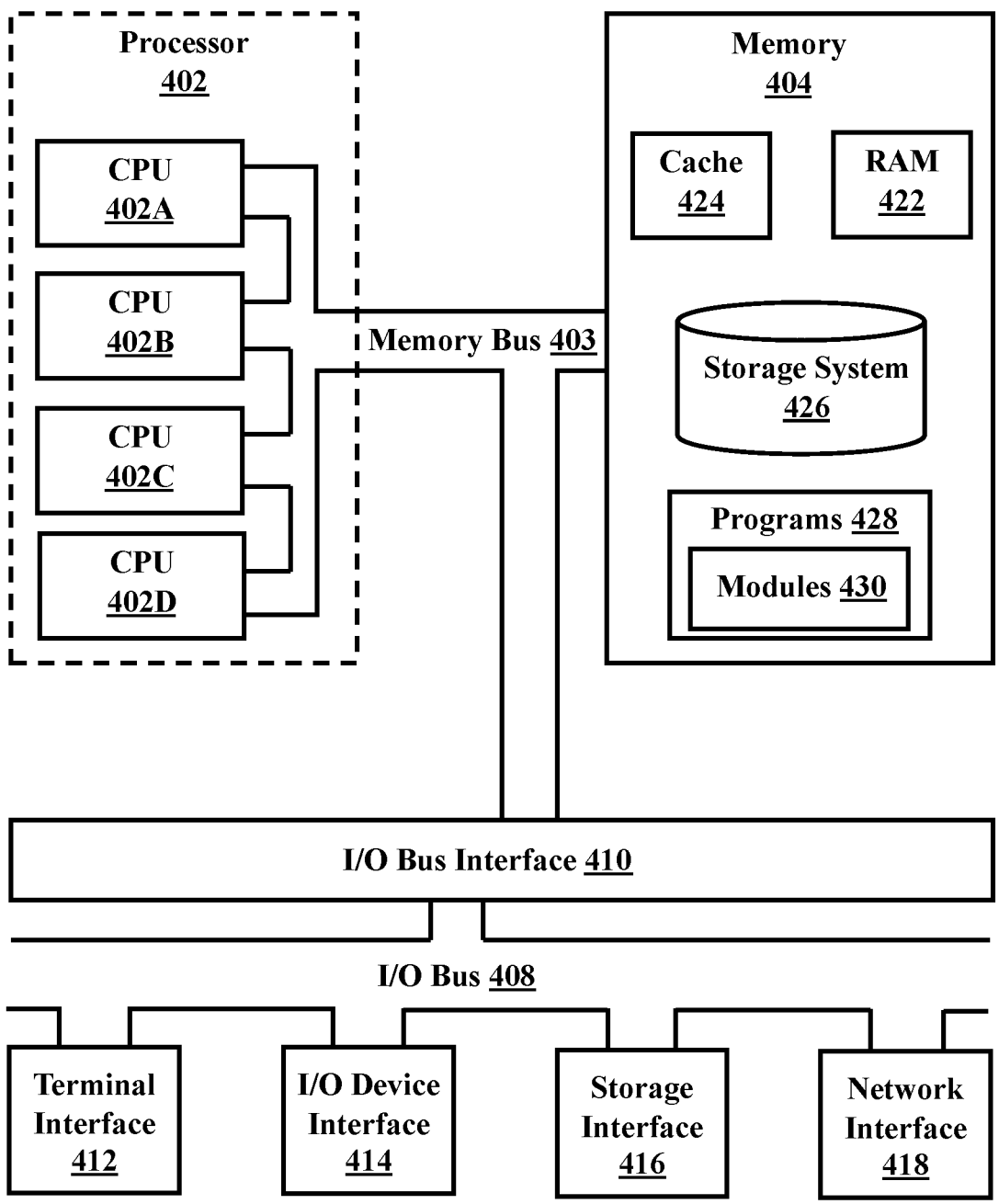
FIG. 4 illustrates a high-level block diagram of an example computer system that may be used in implementing one or more of the methods, tools, and modules, and any related functions, described herein, in accordance with aspects of the present disclosure.

FIG. 4, illustrated is a high-level block diagram of an example computer system 401 that may be used in implementing one or more of the methods, tools, and modules, and any related functions, described herein (e.g., using one or more processor circuits or computer processors of the computer), in accordance with embodiments of the present disclosure. In some embodiments, the major components of the computer system 401 may comprise one or more CPUs 402, a memory subsystem 404, a terminal interface 412, a storage interface 416, an I/O (Input/Output) device interface 414, and a network interface 418, all of which may be communicatively coupled, directly or indirectly, for inter-component communication via a memory bus 403, an I/O bus 408, and an I/O bus interface unit 410.

The computer system 401 may contain one or more general-purpose programmable central processing units (CPUs) 402A, 402B, 402C, and 402D, herein generically referred to as the CPU 402. In some embodiments, the computer system 401 may contain multiple processors typical of a relatively large system; however, in other embodiments the computer system 401 may alternatively be a single CPU system. Each CPU 402 may execute instructions stored in the memory subsystem 404 and may include one or more levels of on-board cache.

System memory 404 may include computer system readable media in the form of volatile memory, such as random access memory (RAM) 422 or cache memory 424. Computer system 401 may further include other removable/non-removable, volatile/non-volatile computer system storage media. By way of example only, storage system 426 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 404 can include flash memory, e.g., a flash memory stick drive or a flash drive. Memory devices can be connected to memory bus 403 by one or more data media interfaces. The memory 404 may include at least one program product having a set (e.g., at least one) of program modules that are configured to carry out the functions of various embodiments.

One or more programs/utilities 428, each having at least one set of program modules 430 may be stored in memory 404. The programs/utilities 428 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Programs 428 and/or program modules 430 generally perform the functions or methodologies of various embodiments.

Although the memory bus 403 is shown in FIG. 4 as a single bus structure providing a direct communication path among the CPUs 402, the memory subsystem 404, and the I/O bus interface 410, the memory bus 403 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 410 and the I/O bus 408 are shown as single respective units, the computer system 401 may, in some embodiments, contain multiple I/O bus interface units 410, multiple I/O buses 408, or both. Further, while multiple I/O interface units are shown, which separate the I/O bus 408 from various communications paths running to the various I/O devices, in other embodiments some or all of the I/O devices may be connected directly to one or more system I/O buses.

In some embodiments, the computer system 401 may be a multi-user mainframe computer system, a single-user system, or a server computer or similar device that has little or no direct user interface, but receives requests from other computer systems (clients). Further, in some embodiments, the computer system 401 may be implemented as a desktop computer, portable computer, laptop or notebook computer, tablet computer, pocket computer, telephone, smartphone, network switches or routers, or any other appropriate type of electronic device.

It is noted that FIG. 4 is intended to depict the representative major components of an exemplary computer system 401. In some embodiments, however, individual components may have greater or lesser complexity than as represented in FIG. 4, components other than or in addition to those shown in FIG. 4 may be present, and the number, type, and configuration of such components may vary.

As discussed in more detail herein, it is contemplated that some or all of the operations of some of the embodiments of methods described herein may be performed in alternative orders or may not be performed at all; furthermore, multiple operations may occur at the same time or as an internal part of a larger process.

The present disclosure may be a system, a method, and/or a computer program product at any possible technical detail level of integration. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN)

or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present disclosure has been described in terms of specific embodiments, it is anticipated that alterations and modification thereof will become apparent to the skilled in the art. Therefore, it is intended that the following claims be interpreted as covering all such alterations and modifications as fall within the true spirit and scope of the disclosure.

What is claimed is:

1. A system for generation of a cyber-physical digital twin ecosystem, the system comprising:
   a memory; and
   a processor in communication with the memory, the processor being configured to perform operations comprising:
   receiving a geofence perimeter of a geospatial region;
   analyzing one or more objects within the geofence perimeter;
   generating a digital twin ecosystem, wherein the digital twin ecosystem includes digital copies of the one or more objects, and wherein generating the digital twin ecosystem includes:
      identifying that at least one of the digital copies of the one or more objects is a full copy,
      identifying that there is a partial copy of the same at least one of the digital copies, wherein the partial copy is outside the geofence perimeter,
      parsing the full copy to an instance missing from the partial copy, and
      combining the instance with the partial copy; and
   presenting a simulation of the digital twin ecosystem to a user.

2. The system of claim 1, wherein generating the digital twin ecosystem includes:
   identifying that at least one of the digital copies of the one or more objects is a partial copy;
   identifying that there is a second partial copy of the same at least one of the digital copies; and
   combining the partial copy and the second partial copy to make a full copy of the at least one of the digital copies.

3. The system of claim 2, wherein the processor is further configured to perform operations comprising:
   analyzing the partial copy and the second partial copy;
   determining, based on the analyzing, that the at least one of the digital copies associated with the partial copy and second partial copy is a moveable object; and
   predicting payload information for the moveable object.

4. The system of claim 3, wherein determining that the at least one of the digital copies associated with the partial copy and second partial copy is the moveable object includes:
   identifying that the partial object is in a first area of the geofence perimeter; and
   identifying that the second partial object is in a second area of the geofence perimeter.

5. The system of claim 3, wherein determining that the at least one of the digital copies associated with the partial copy and second partial copy is the moveable object includes:
  identifying that the partial object is in a first area of the geofence perimeter; and
  identifying that the second partial object is outside the geofence perimeter.

6. The system of claim 1, wherein generating the digital twin ecosystem includes:
  identifying that at least one of the digital copies of the one or more objects is a full copy;
  identifying that there is a partial copy of the same at least one of the digital copies;
  ranking the full copy above the partial copy; and
  presenting the full copy in the simulation of the digital twin ecosystem to the user.

7. A computer-implemented method for generation of a cyber-physical digital twin ecosystem, the method comprising:
  receiving, by a processor, a geofence perimeter of a geospatial region;
  analyzing one or more objects within the geofence perimeter;
  generating a digital twin ecosystem, wherein the digital twin ecosystem includes digital copies of the one or more objects, and wherein generating the digital twin ecosystem includes:
    identifying that at least one of the digital copies of the one or more objects is a full copy,
    identifying that there is a partial copy of the same at least one of the digital copies, wherein the partial copy is outside the geofence perimeter,
    parsing the full copy to an instance missing from the partial copy, and
    combining the instance with the partial copy; and
  presenting a simulation of the digital twin ecosystem to a user.

8. The computer-implemented method of claim 7, wherein generating the digital twin ecosystem includes:
  identifying that at least one of the digital copies of the one or more objects is a partial copy;
  identifying that there is a second partial copy of the same at least one of the digital copies; and
  combining the partial copy and the second partial copy to make a full copy of the at least one of the digital copies.

9. The computer-implemented method of claim 8, further comprising:
  analyzing the partial copy and the second partial copy;
  determining, based on the analyzing, that the at least one of the digital copies associated with the partial copy and second partial copy is a moveable object; and
  predicting payload information for the moveable object.

10. The computer-implemented method of claim 9, wherein determining that the at least one of the digital copies associated with the partial copy and second partial copy is the moveable object includes:
  identifying that the partial object is in a first area of the geofence perimeter; and
  identifying that the second partial object is in a second area of the geofence perimeter.

11. The computer-implemented method of claim 9, wherein determining that the at least one of the digital copies associated with the partial copy and second partial copy is the moveable object includes:
  identifying that the partial object is in a first area of the geofence perimeter; and
  identifying that the second partial object is outside the geofence perimeter.

12. The computer-implemented method of claim 7, wherein generating the digital twin ecosystem includes:
  identifying that at least one of the digital copies of the one or more objects is a full copy;
  identifying that there is a partial copy of the same at least one of the digital copies;
  ranking the full copy above the partial copy; and
  presenting the full copy in the simulation of the digital twin ecosystem to the user.

13. A computer program product for generation of a cyber-physical digital twin ecosystem comprising a computer readable storage medium having program instructions embodied therewith, the program instructions executable by a processor to cause the processor to perform operations, the operations comprising:
  receiving a geofence perimeter of a geospatial region;
  analyzing one or more objects within the geofence perimeter;
  generating a digital twin ecosystem, wherein the digital twin ecosystem includes digital copies of the one or more objects, and wherein generating the digital twin ecosystem includes:
    identifying that at least one of the digital copies of the one or more objects is a full copy,
    identifying that there is a partial copy of the same at least one of the digital copies, wherein the partial copy is outside the geofence perimeter,
    parsing the full copy to an instance missing from the partial copy, and
    combining the instance with the partial copy; and
  presenting a simulation of the digital twin ecosystem to a user.

14. The computer program product of claim 13, wherein generating the digital twin ecosystem includes:
  identifying that at least one of the digital copies of the one or more objects is a partial copy;
  identifying that there is a second partial copy of the same at least one of the digital copies; and
  combining the partial copy and the second partial copy to make a full copy of the at least one of the digital copies.

15. The computer program product of claim 14, wherein the processor is further configured to perform operations comprising:
  analyzing the partial copy and the second partial copy;
  determining, based on the analyzing, that the at least one of the digital copies associated with the partial copy and second partial copy is a moveable object; and
  predicting payload information for the moveable object.

16. The computer program product of claim 15, wherein determining that the at least one of the digital copies associated with the partial copy and second partial copy is the moveable object includes:
  identifying that the partial object is in a first area of the geofence perimeter; and
  identifying that the second partial object is in a second area of the geofence perimeter.

17. The computer program product of claim 15, wherein determining that the at least one of the digital copies associated with the partial copy and second partial copy is the moveable object includes:
  identifying that the partial object is in a first area of the geofence perimeter; and identifying that the second partial object is outside the geofence perimeter.

\* \* \* \* \*